United States Patent
Raman et al.

(10) Patent No.: US 7,148,079 B1
(45) Date of Patent: Dec. 12, 2006

(54) DIAMOND LIKE CARBON SILICON ON INSULATOR SUBSTRATES AND METHODS OF FABRICATION THEREOF

(75) Inventors: Sankar N. Raman, Austin, TX (US); Patrick L. Stallings, Round Rock, TX (US); William C. Barnes, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 364 days.

(21) Appl. No.: 10/285,860

(22) Filed: Nov. 1, 2002

(51) Int. Cl.
*H01L 21/00* (2006.01)

(52) U.S. Cl. .................. 438/105; 438/758; 438/488

(58) Field of Classification Search ............ 438/758, 438/286, 488, 626, 631, 633, 439, 105; 427/569, 427/402, 249.7; 428/411.1, 408, 212, 336
See application file for complete search history.

(56) References Cited

U.S. PATENT DOCUMENTS

| | | | |
|---|---|---|---|
| 5,183,529 A | | 2/1993 | Potter et al. |
| 5,272,104 A | * | 12/1993 | Schrantz et al. ............ 438/105 |
| 5,561,303 A | * | 10/1996 | Schrantz et al. ............... 257/77 |
| 6,086,962 A | * | 7/2000 | Mahoney et al. ............ 427/577 |
| 6,332,363 B1 | * | 12/2001 | Molloy et al. ................. 73/776 |
| 6,368,924 B1 | * | 4/2002 | Mancini et al. ............. 438/286 |
| 6,472,017 B1 | * | 10/2002 | Veerasamy et al. ...... 427/249.7 |
| 6,531,182 B1 | * | 3/2003 | Veerasamy et al. ...... 427/249.7 |
| 6,548,937 B1 | * | 4/2003 | Klee et al. .................... 310/324 |
| 6,592,993 B1 | * | 7/2003 | Veerasamy .................. 428/408 |
| 6,659,596 B1 | * | 12/2003 | Keefe et al. .................... 347/63 |
| 2002/0028289 A1 | * | 3/2002 | Veerasamy ............... 427/249.7 |
| 2002/0098681 A1 | * | 7/2002 | Hu et al. .................... 438/626 |
| 2002/0110648 A1 | * | 8/2002 | Lee et al. .................... 427/569 |
| 2003/0021997 A1 | * | 1/2003 | Veerasamy et al. ...... 428/411.1 |
| 2004/0154570 A1 | * | 8/2004 | Mabuchi et al. .......... 123/90.52 |

FOREIGN PATENT DOCUMENTS

JP   02002299263 A  * 10/2002

* cited by examiner

*Primary Examiner*—B. William Baumeister
*Assistant Examiner*—Victor V. Yevsikov

(57) ABSTRACT

Diamond like carbon silicon on insulator substrates and methods of fabrication thereof are disclosed. In one form, a process for creating a composite structure for fabricating an electronic device is disclosed. The process includes forming a first diamond-like carbon layer on a substrate and coupling a support layer to the diamond-like carbon layer. The substrate is reduced to provide a device layer for fabricating a microelectronic device.

25 Claims, 5 Drawing Sheets

DIAMOND LIKE CARBON SILICON ON INSULATOR SUBSTRATES AND METHODS OF FABRICATION THEREOF

FIELD OF THE DISCLOSURE

The present invention generally relates to microelectronics and, more particularly, silicon on insulator substrates including diamond-like carbon materials and methods of fabrication thereof.

BACKGROUND

As microelectronic device sizes continue to shrink, capacitive elements within microelectronic structures will degrade overall device performance while increasing power consumption. For example, capacitive elements have the ability, and demand, to store electrical charges. Each structure within an electronic device that is operable to pass a current or conduct electricity has a certain level of capacitance. For example, each time a transistor is turned on, it must first charge all of its internal capacitance before it can begin to conduct electricity. This charge time can be relatively long depending on the overall complexity of the integrated electronic circuit and number of transistors.

Of particular interest within MOS devices is the junction capacitance that exists between junction regions of an MOS transistor. For example, impurities are added to silicon at select regions to produce a drain and a source for an MOS transistor. Adding impurities to the silicon provides a 'doped' region and alters the electrical properties of the silicon. The junctions that exist between these doped regions result in a 'junction capacitance' for electronic devices. As microelectronic devices continue to become more complex, an increase in the number of transistors used within circuits will result in an overall increase in junction capacitances. As such, there is a need for alternative processes and structures for reducing the overall capacitance of microelectronic circuits and devices.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE FIGURES

Advantageous embodiments of the invention are illustrated in FIGS. 1–6. The present invention is directed toward providing alternative structures and processes for reducing undesired capacitance's of integrated electronic circuits.

Figure 1:
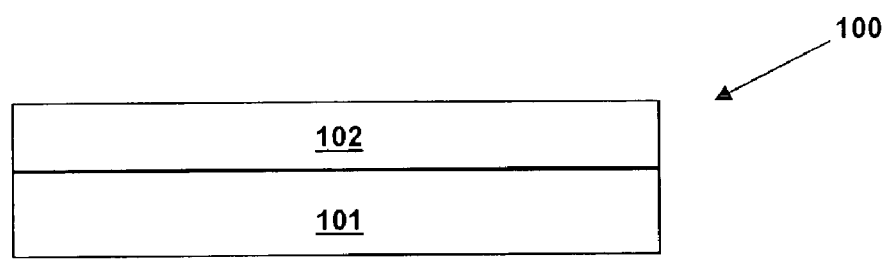
FIG. 1 illustrates a diamond-like carbon silicon on insulator structure according to one aspect of the invention.

FIG. 1 illustrates a diamond like carbon silicon on insulator structure according to one aspect of the invention. Structure 100 includes a device layer 101 made of a substrate material such as silicon and an insulator layer 102 made of a diamond-like material such as diamond like carbon (DLC). For example, a DLC insulator layer includes an amorphous structure having both SP2 and SP3 bonded carbon and as such include both diamond-like Poly-Crystalline Diamond (PCD) and graphitic properties. Insulator layer 102 includes unique electrical characteristics such as resistivity greater than approximately $10^{12}$ ohms per centimeter. Insulator layer 102 further includes a thermal conductivity of approximately 1000 to 2500 Watts/meter Kelvin at approximately room temperature and a dielectric constant varied between Five and Seven (5 and 7).

In one embodiment, structure 100 includes a device layer 101 made of a silicon material and insulator layer 102 made of a diamond-like carbon material and allows for greater processing flexibility due to an increased relative high temperature range of silicon and diamond-like carbon material. As such, structure 100 including a DLC insulator on a silicon substrate advantageously allows for greater processing flexibility for fabricating microelectronic devices while ensuring that insulative properties desired for silicon on insulation structures are provided and electrical characteristics of fabricated electronic devices can be achieved.

Figure 2:
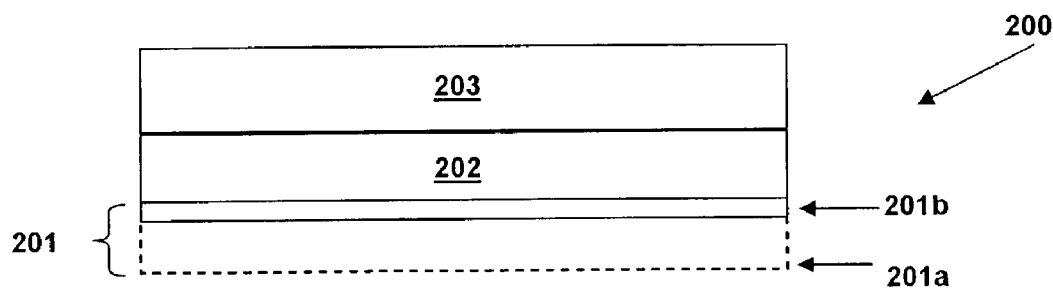
FIG. 2 illustrates a support layer coupled to diamond-like carbon silicon on insulator structure according to one aspect of the invention.

FIG. 2 illustrates a support layer coupled to a substrate portion of a diamond like carbon silicon on insulator structure according to one aspect of the invention. Structure 200 includes a device layer 201 and an insulator layer 202 coupled to a non-process or non-device portion of device layer 201. A support layer 203 made from Silicon or other semiconductors or combinations of semiconductors such as type III–V semiconductor materials, GaAs etc., is coupled to insulator layer 202 using an electro-mechanically bonding process (i.e. High Temperature electro bonding) to provide structural support when processing device layer 201. For example, during a reduction process, device layer 201 is reduced to a thickness having desired physical or electrical characteristics for fabricating electronic devices on device layer 201. For example, device layer 201 having an first thickness 201a may be reduced using a substrate reducing process such as grinding to achieve a second device layer thickness 201b for device layer 201. For example, an overall thickness of 2000 microns to 3000 microns for resulting thickness 201b of device layer 201. Note, that one or more types of grinding processes may be used and may also include polishing techniques for cleaning the device layer 201. For example, a chemical mechanical polishing process may be employed to provide a planar device processing surface that is free from defects.

Figure 3:
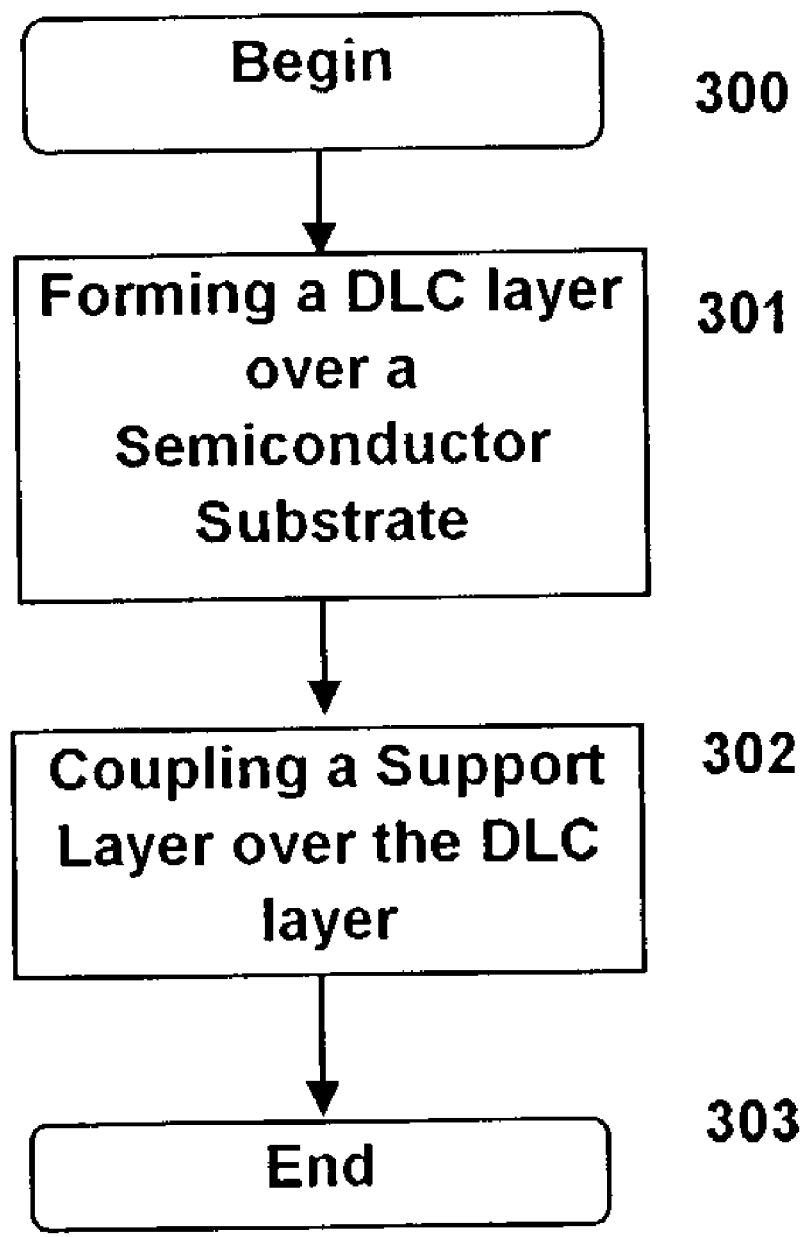
FIG. 3 illustrates a process for fabricating silicon on diamond like carbon structure according to one aspect of the invention.

FIG. 3 illustrates a process for fabricating a silicon on diamond-like carbon structure according to one aspect of the invention. The process begins generally at step 300. At step 301, a diamond-like carbon layer of material is formed over a semiconductor substrate to form a substrate having an insulative material on a non-device side of the substrate. The diamond-like carbon layer may be deposited using one or more types of processes such as low-temperature and/or high temperature deposition processes. A resulting diamond like carbon layer is desirable to provide insulative properties to reduce device leakage and overall device capacitance thereby enhancing performance characteristics of microelectronic devices fabricated using the device side of the substrate.

Upon forming a diamond-like carbon layer over the semiconductor substrate, a support layer is coupled to the diamond-like carbon layer 302 to provide structural support during subsequent processing. For example, support structures may include silicon material, GaAs or other types of Type III–V semicondutors or combinations of materials to provide a support layer that may be coupled to a DLC material. Upon coupling the support layer to the diamond-like carbon layer, the process proceeds to step 303 where the process ends. A resulting structure includes a diamond-like carbon layer operable as an insulator layer, a support layer coupled to one side of the diamond like layer to provide structural support, and a substrate having a device layer for fabricating a microelectronic device.

Figure 4:
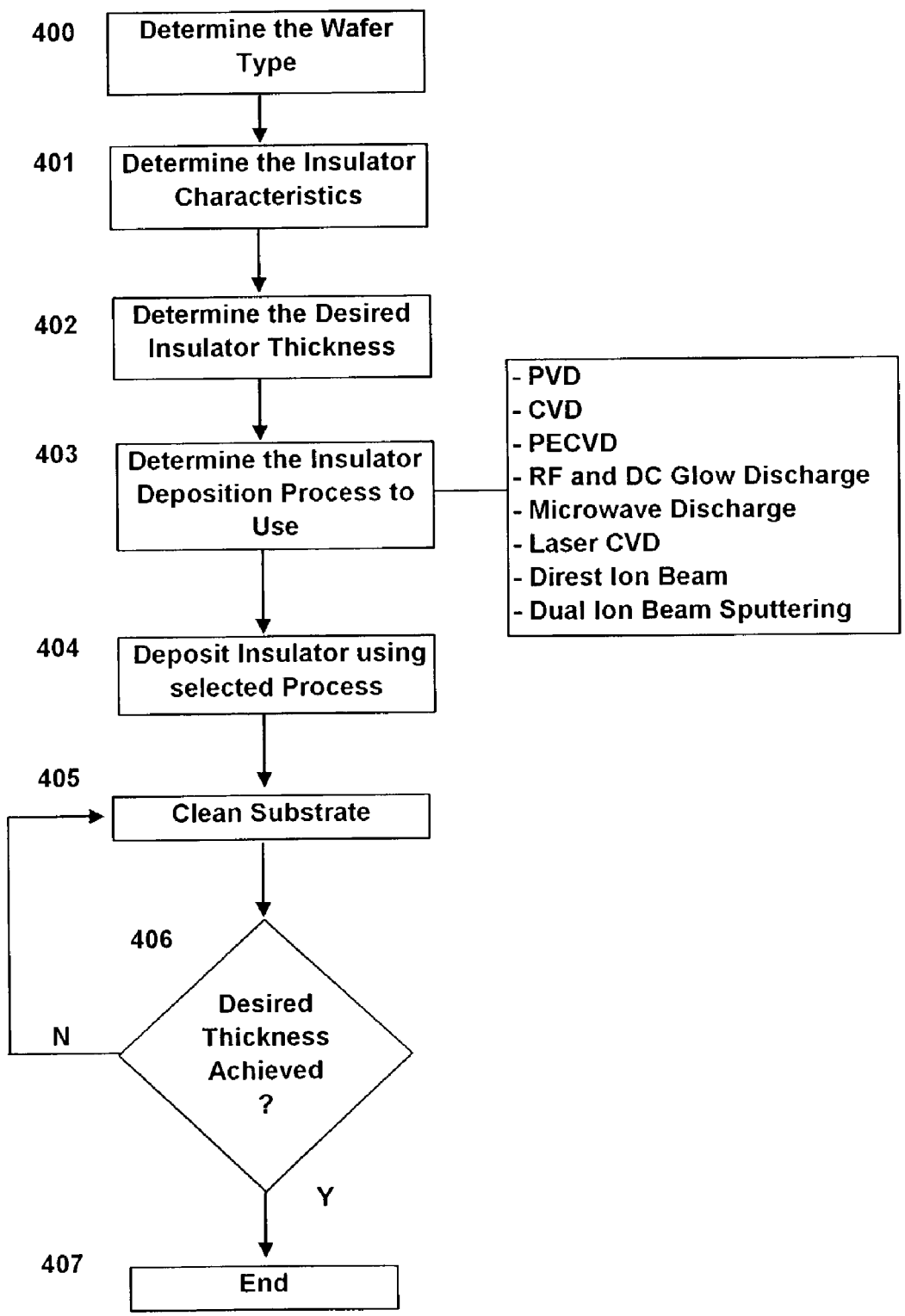
FIG. 4 illustrates a process for fabricating a diamond-like carbon layer over a substrate according to one aspect of the invention.

FIG. 4 illustrates a process for fabricating a diamond-like carbon layer over a substrate according to one aspect of the invention. The process of FIG. 4 begins at step 400 by determining the type of substrate being used (i.e. silicon, GaAs, etc.) and desired device specifications. For example, the device specifications may include providing a substrate having a diamond-like carbon layer with a thickness between 0.05 microns and 10 microns depending on applications and device power requirements. Upon determining the substrate to be used and the device specifications, a type of insulator is determined at step 401 based on the desired insulative characteristics for the subsequent device to be fabricated. For example, a diamond-like carbon insulator layer may be desired and includes diamond-like characteristics having SP2 and SP3 carbon that may bond to the selected substrate. As such, based on the desired insulative characteristics and resulting desired device characteristics, an insulator material is selected for depositing the insulator material on a portion of the substrate and a desired thickness of the selected insulator is determined 402.

Processing parameters for a selected fabrication tool set are determined 403 and may include selecting a deposition rate, a process temperature, a pressure within a deposition chamber, a flow-rate of a gas, a deposition time and other parameters that may be used to provide the desired diamond-like coating or film. For example, depending on the fabrication tool set selected and the desired electrical characteristics of the resulting structure, a PECVD process, PVD process, RF and DC glow discharge processes, or microwave discharge process, CVD process, laser CVD process, direct ion beam deposition process, or dual ion beam sputtering process may be employed to provide a diamond-like layer.

In one embodiment, a Chemical Vapor Deposition chamber pumps a hydrogen-methane mixture in a low pressure chamber, under 100 torr, containing a semiconductor substrate heated between 700C and 900C. DC electric arcs or microwaves or hot filament break down the gases. As a consequence, hydrogen atoms stabilize the substrate and carbon atoms settle on the substrate in a tight tetrahedral-bonding characteristic of Diamond. The deposition rates varying from 1 micron to 20 micron per hour.

In another embodiment, a Plasma Impulse Chemical Vapor Process (PICVD) process may be employed and one or more substrates may be placed within an ambient of a PICVD process chamber. The PICVD process is a microwave plasma assisted variation of the regular CVD process. The advantages of this technique are high deposition rates and suitable for high aspect fill structures and deposition at low temperatures. In the PICVD process, the chamber is filled with a hydrogen-methane gas at approximately 1 mbat vacuum range and the plasma generated causes Carbon to deposit on the substrate in a tightly tetrahedral bonding similar to diamond.

Carbon atoms bond as a diamond-like carbon layer or thin film to the substrate over a period of time to achieve an insulator thickness having desired insulative properties. Upon achieving a desired thickness, a cleaning stage 406 is initiated and provides an inert gas, such as argon, within the process chamber. An RF source is introduced to the process chamber ionizing the argon gas and bombarding the substrate to clean the substrate. The desired layer or film thickness may be determined 405 and subsequent deposition processes may be employed until the desired diamond like carbon thin film or coating thickness is obtained. Upon achieving a desired thickness, an additional cleaning process may be used to clean the substrate as needed or the process ends 407.

In another embodiment, a low temperature deposition process may be employed for depositing a diamond-like carbon insulator layer or film on a substrate. For example, a diamond-like carbon insulator layer or film may be provided using a high-vacuum environment within a process chamber by a Physical Vapor Deposition (PVD) process. For example, a substrate may be placed within the high-vacuum environment and a benzene gas may be introduced to the process chamber and disassociated and ionized by a DC arc discharge (plasma discharge). The resulting ions migrate toward the substrate and coat the substrate due to negatively biasing the substrate relative to the plasma discharge. Collisions between the ions in the gas phase result in the formation of SP2 and SP3 bonded carbon structures which are drawn to the substrate surface. The resulting substrate maintains the electrical characteristics of the desired diamond-like carbon silicon on insulator structure for subsequent processing. Upon cleaning achieving a desired thickness, the substrate may be cleaned again and/or the process proceeds to step 407 where the process ends.

Figure 5:
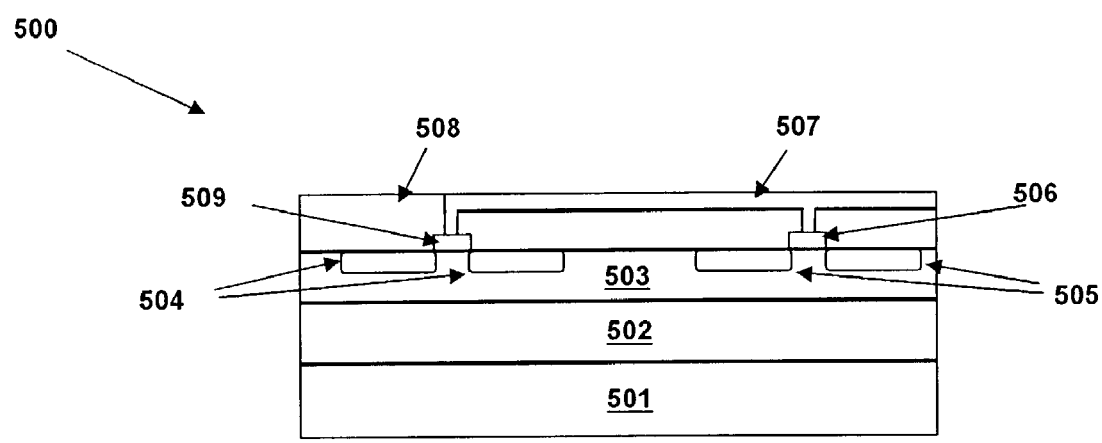
FIG. 5 illustrates a microelectronic circuit fabricated using a silicon on diamond-like carbon insulator substrate according to one aspect of the invention.

FIG. 5 illustrates a microelectronic circuit fabricated using a silicon on diamond like carbon insulator substrate according to one aspect of the invention. A side perspective view of a microelectronic circuit 500 illustrates a diamond like carbon layer 502 coupled to a support layer 501 for providing structural support for microelectronic circuit 500. A device layer 503 includes a first transistor including source and drain regions 504 and a gate material coupled to an oxide shown collectively at 509. Similarly, a second transistor includes source and drain regions 505 and gate coupled to an oxide material shown collectively at 506. A contact layer 507 made of a conductive material provides bias voltages to each gate 509 and 506. Similarly, a second conductive layer 508 includes a conductive material operable to provide a bias for each source and drain as needed.

During operation, sub-threshold leakage for device layer 503 is significantly reduced through providing a diamond-like carbon layer 502 to a non-device side of device layer 503. The electrical and insulative properties of the diamond-like carbon material facilitates efficient operation of microelectronic circuit 500 through reducing sub-threshold leakage currents for first and second transistor and further through providing an overall decrease in system capacitance of microelectronic circuit 500.

Figure 6:
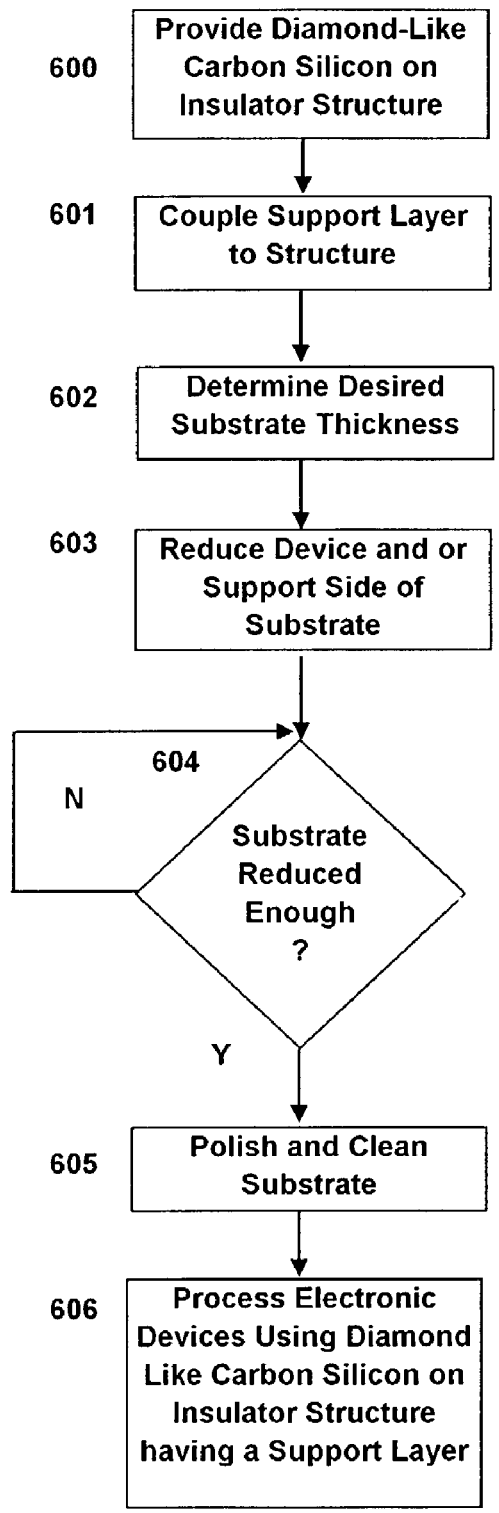
FIG. 6 illustrates a process for reducing a device portion of a diamond-like carbon silicon on insulator substrate according to one aspect of the invention.

FIG. 6 illustrates a process for reducing a device portion of a diamond-like carbon silicon on insulator substrate according to one aspect of the invention. The process begins by providing a structure 600 having a substrate and an insulator layer formed on a back surface, non-device surface, or non-processed surface of the substrate. A support layer, such as a handle-wafer, is coupled to the insulative layer using one or more types of processes For example, a cupport layer may be provided based on the type of devices to be fabricated and can be either Si or other semiconductors or combinations of materials (i.e. GaAs) to provide. The Support layer can be electro mechanically bonded or in certain cases be epitaxially grown as is the case in III–V semiconductors.

Upon coupling the support layer to the diamond-like carbon layer, a desired substrate thickness is determined 602 based on an electrical characteristic for fabricating microelectronic structures using a reduced substrate.

For example, the following equation can be used to determine the amount of the original substrate thickness that needs to be removed:

$$RA(D1)=T(D1o)-T(D1d) \qquad \text{eqn. 1}$$

$$(Ss+D+Sa)-Sd \qquad \text{eqn. 2}$$

Where RA(D1) is the amount of active (device) substrate to be removed from the device layer, T(D1o) is the originally thickness of the device layer, and T(D1d) is the desired thickness of the device layer.

Once the amount RA(D1) is determined, the amount that the support layer needs to be reduced is provided by:

$$RA(S1)=T(Sd)-(T(So)-RA(D1)) \qquad \text{eqn. 3}$$

Where RA(S1) is the amount of the support layer to be removed, T(Sd) is the desired thickness of the total substrate, T(So) is the original thickness of the total substrate.

Upon determining the reduction amounts of the device and/or support layer of the substrate is reduced at step 603. It will be appreciated that for illustrative purposes the values of equations 1, 2 and 3 represent specific value. However, it will also be appreciated that ranges of acceptable values may be used providing additional flexibility during the reduction process. For example, it may generally be able to only reduce the device layer to meet a desired range requirement of the overall substrate thickness.

The support layer is generally reduced first to avoid contamination of the device layer. However, processed that allow subsequent reduction of the support layer can be used. A back grind process as is well known the art can be used to reduce the support layer. For the device layer, a combination of reduction techniques that result in a surface suitable for the manufacture of microelectronic devices can be used. Example of these processes include mechanical grinding, etch processing, and an electromechanical polishing processes. Note, that in other embodiments that the amount of reduction amount may occur entirely at the device layer, and be based solely upon the desired thickness of the device layer, or the reduction amount (A) may occur entirely the support layer and be based solely on the thickness of the overall device.

604 and the diamond-like carbon silicon on insulator structure including the support layer is polished and/or cleaned 605 to ensure a planar and defect clean surface for subsequent device fabrication and processing 606.

Although the disclosed embodiments have been described in detail, it should be understood that various changes, substitutions and alterations can be made to the embodiments without departing from their spirit and scope.

What is claimed is:

1. A process for forming a silicon on insulator substrate for use in fabricating an electronic device, the process comprising:
    forming a diamond like carbon layer over a semiconductor substrate comprising a device side and a non-device side, wherein the diamond-like carbon layer is formed on the non-device side of the semiconductor substrate within a deposition chamber hosting the substrate; and
    coupling a support layer to the diamond like carbon layer to provide structural support.

2. The process as described in claim 1 further comprising forming the diamond-like carbon layer using a low temperature deposition process.

3. The process as described in claim 2 further comprising forming the diamond-like carbon layer using a PVD process.

4. The process as described in claim 1 further comprising forming the diamond-like carbon layer using a high temperature deposition process.

5. The process as described in claim 4 further comprising forming the diamond-like carbon layer using a CVD process.

6. The process of claim 1, wherein coupling the support layer includes coupling a support layer comprising a semiconductor material.

7. The process as described in claim 1 further comprising:
    reducing a thickness of the semiconductor substrate by reducing the device side of the semiconductor substrate.

8. The process as described in claim 7 further comprising:
    determining a thickness of the diamond-like carbon layer prior to reducing the thickness, wherein reducing the thickness is based upon the thickness of the diamond-like carbon layer.

9. The process as described in claim 7 wherein the reducing comprises grinding the device side of the substrate to thin the substrate to a thickness operable to fabricate electronic devices.

10. A process for fabricating an electronic device comprising:
    providing a substrate within a deposition chamber;
    forming a diamond-like carbon layer on a first side of the substrate;
    reducing a second side of the substrate to a thickness operable to allow fabrication of an electronic device at the second side of the substrate; and
    coupling a support layer to the diamond-like layer, the support layer opposing the second side of the substrate.

11. The process of claim 10 further comprising:
    fabricating the electronic device over the diamond like carbon layer and at least partially on the second side of the substrate.

12. The process as described in claim 10 further comprising forming the diamond-like carbon layer using a low temperature deposition process.

13. The process as described in claim 12 further comprising forming the diamond-like carbon layer using a PVD process.

14. The process as described in claim 10 further comprising forming the diamond-like carbon layer using a high temperature deposition process.

15. The process as described in claim 14 leer comprising forming the diamond-like carbon layer using a CVD process.

16. The process of claim 10, wherein coupling the support layer includes coupling a support layer comprising a semiconductor material.

17. A process comprising:
  forming a diamond like carbon layer over a semiconductor substrate, the semiconductor substrate suitable for formation of integrated circuit devices; and
  coupling a support layer to the diamond like carbon layer to provide structural support for the carbon layer and the semiconductor substrate.

18. The process of claim 17, further comprising:
  reducing a thickness of the semiconductor substrate after formation of the diamond like carbon layer.

19. The process of claim 17, further comprising:
  reducing a thickness of the semiconductor substrate after coupling the support layer.

20. The process of claim 17 comprising:
  determining a thickness of the diamond-like carbon layer;
  reducing the thickness of the substrate; and
  measuring a resulting thickness of the substrate.

21. The process as described in claim 17 further comprising forming the diamond-like carbon layer using a low temperature deposition process.

22. The process as described in claim 21 further comprising forming the diamond-like carbon layer using a PVD process.

23. The process as described in claim 17 further comprising forming the diamond-like carbon layer using a high temperature deposition process.

24. The process as described in claim 23 further comprising forming the diamond-like carbon layer using a CVD process.

25. The process of claim 17, wherein coupling the support layer includes coupling a support layer comprising a semiconductor material.

* * * * *

UNITED STATES PATENT AND TRADEMARK OFFICE
CERTIFICATE OF CORRECTION

| | | |
|---|---|---|
| PATENT NO. | : 7,148,079 B1 | |
| APPLICATION NO. | : 10/285860 | |
| DATED | : December 12, 2006 | |
| INVENTOR(S) | : Sankar N. Raman et al. | |

It is certified that error appears in the above-identified patent and that said Letters Patent is hereby corrected as shown below:

Column 6, Line 62, change "leer" to --further--

Signed and Sealed this

Seventh Day of August, 2007

JON W. DUDAS
*Director of the United States Patent and Trademark Office*